United States Patent

Kashida

Patent Number: 5,502,734
Date of Patent: Mar. 26, 1996

[54] CODE TRANSMITTING METHOD

[75] Inventor: Motokazu Kashida, Musashino, Japan

[73] Assignee: Canon Kabushiki Kaisha, Tokyo, Japan

[21] Appl. No.: 333,231

[22] Filed: Nov. 2, 1994

Related U.S. Application Data

[63] Continuation of Ser. No. 29,354, Mar. 10, 1993, which is a continuation of Ser. No. 491,812, Mar. 12, 1990, abandoned.

[30] Foreign Application Priority Data

Mar. 18, 1989 [JP] Japan ........................... 1-67364

[51] Int. Cl.$^6$ ................................. H03M 13/00
[52] U.S. Cl. ............................. 371/37.4; 371/2.1
[58] Field of Search ..................... 371/37.4, 37.1, 371/37.2, 49.1, 50.1, 51.1, 2.1

[56] References Cited

U.S. PATENT DOCUMENTS

| | | | |
|---|---|---|---|
| 4,281,355 | 7/1981 | Wada | 371/37.4 X |
| 4,413,340 | 11/1983 | Odaka | 371/37.4 X |
| 4,649,542 | 3/1987 | Nishimura et al. | 371/37.4 |
| 4,716,567 | 12/1987 | Ito et al. | 371/50.1 X |
| 4,750,178 | 6/1988 | Sako et al. | 371/37.4 |
| 4,779,276 | 10/1988 | Kashida | 371/57 |
| 4,796,261 | 1/1989 | Moriwaki | 371/37.4 |
| 4,802,171 | 1/1989 | Rasky | 371/43 |
| 4,852,102 | 7/1989 | Yamaguchi | 371/37.4 X |
| 4,907,233 | 3/1990 | Deutsch | 371/37.4 |
| 4,958,350 | 9/1990 | Worley, III et al. | 371/37.4 |
| 4,975,915 | 12/1990 | Sako et al. | 371/37.4 |

FOREIGN PATENT DOCUMENTS

| | | |
|---|---|---|
| 62-149073 | 3/1987 | Japan . |
| 62-30436 | 9/1987 | Japan . |

Primary Examiner—Robert W. Beausoliel, Jr.
Assistant Examiner—Glenn Snyder
Attorney, Agent, or Firm—Fitzpatrick, Cella, Harper & Scinto

[57] ABSTRACT

In a code transmitting method for transmitting an information code with an error detection or error correction code, a first error detection or correction code derived by sampling the information code diagonally on a matrix formed by two dimensionally arraying the information code is added to the matrix along a row direction, a second error detection or correction code derived by sampling, along the row direction, the code of the matrix having the first error detection or correction code added thereto is added to the matrix along the row direction, and the codes in the respective rows of the matrix having the second error detection or correction code added thereto are sequentially transmitted.

13 Claims, 6 Drawing Sheets

| SYNCHRO-NOUS DATA | INFORMATION DATA | ERROR DETECTION AND CORRECTION CODE |
|---|---|---|

FIG. 1

| SYNCHRO-NOUS DATA | INFORMATION DATA | INNER CODE CHECK POINT |
|---|---|---|
| --- | --- | --- |
| SYNCHRO-NOUS DATA | INFORMATION DATA | INNER CODE CHECK POINT |
| SYNCHRO-NOUS DATA | OUTER CODE CHECK POINT | INNER CODE CHECK POINT |

FIG. 2

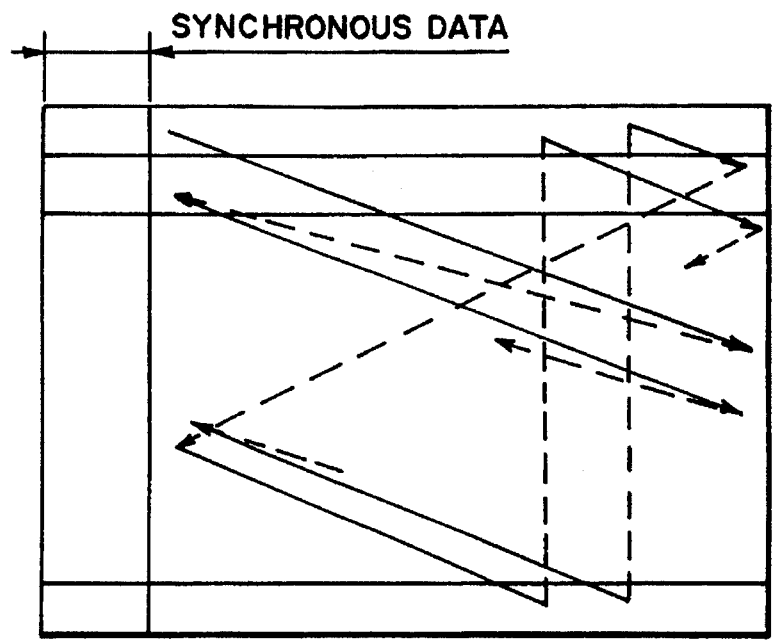
F I G. 5
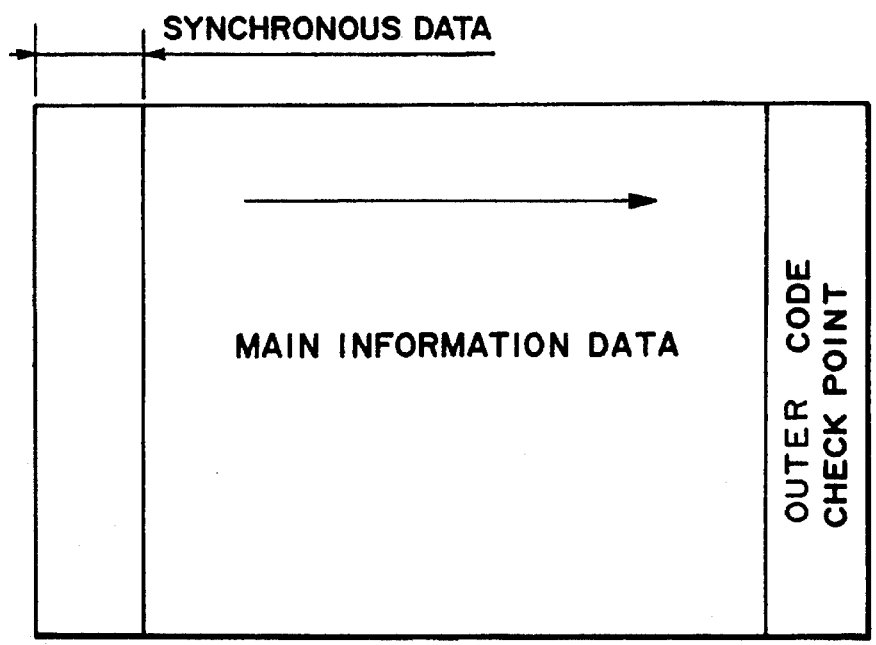
F I G. 6

| 1 | 2 | 3 | 4 | 5 | 6 | 7 | 8 | 9 | 10 | 11 |
|---|---|---|---|---|---|---|---|---|----|----|
| $P_{11}$ | $D_1$ | $D_2$ | $P_{12}$ | $D_3$ | $D_4$ | $P_{13}$ | $D_5$ | $D_6$ | $P_{14}$ | $D_7$ |

5,502,734

1

CODE TRANSMITTING METHOD

This application is a continuation of application Ser. No. 08/029,354 filed Mar. 10, 1993, which application is a continuation of application Ser. No. 07/491,812 filed Mar. 12, 1990. Now abandoned.

BACKGROUND OF THE INVENTION

1. Field of the Invention

The present invention relates to a code transmitting method, and more particularly to a code transmitting method for transmitting a code having an error detection or correction code comprising a product code added thereto.

2. Related Background Art

In prior art digital code transmission, particularly in a field of magnetic recording, it was necessary to suppress a low frequency band component of a digital code to be recorded. For this purpose, for example, an 8-bit code is converted to a 9-bit code (8/9 conversion) in order to use only the code which does not include the low frequency component. In this method, however, the redundancy of the code is so high that the volume of data to be transmitted increases.

As a method which prevents the increase of the redundancy, a mapping coding method has been known. It is applicable only to a code sequence having a high correlation among codes, and the low frequency band component of the code sequence can be suppressed by making use of the correlation. For example, an input code is differentially encoded and a code in a vicinity of zero level is converted to a code having a small DSV (digital sum value) so that the low frequency band component of the code sequence is suppressed. For example, a 4/4 mapping coding method which converts a 4-bit differential code to a 4-bit code has been known.

However, since the mapping coding method makes use of the correlation of the code sequence, the suppression effect for the low frequency band component is not attained for the code having no correlation. For example, it is difficult for the error detection or correction code to suppress the low frequency band component by the mapping coding method. As a result, the suppression effect for the low frequency band component is low for the entire code sequence including the information code and the error detection or correction code. This causes the increase of a coding error is a decoding process.

FIG. 1 shows a format of a data frame of a code sequence of the type described above. In FIG. 1, information data is an information code sequence coded by the mapping coding method, and an error detection or correction code is a check point such as Hamming code or Reed-Solomon code.

FIG. 2 shows a data matrix of a product code comprising inner codes provided in the data frame and outer codes provided by arranging the data frame in lengthwise. In this arrangement, since check codes are arranged two-dimensionally, it is suitable to handle image data.

However, assuming that the respective rows (respective data frames) are sequentially transmitted in the data matrix of FIG. 2, the suppression effect for the low frequency band component by the mapping coding method is not expected because there is no correlation of data in a portion at which the inner code and the outer code are continuously transmitted. Particularly in a data frame which comprises only the check points of the outer code and the inner code, the check points continuously appear for a long time. As a result, the suppression effect for the low frequency band component of the code sequence in the vicinity of the check points is materially lowered.

2

In the Japanese Patent Application No. 60-169420 filed by the assignee of the present invention, a method for suppressing the low frequency band component by distributedly arranging the check points of the data frame in the information codes of the respective data frames as shown in FIG. 3, is disclosed.

Further, in the Japanese Patent Application No. 60-291172 filed by the assignee of the present invention, a method for switching rows in the data matrix to which the outer codes of the product code are to be added, is disclosed.

However, in the method of distributedly arranging the check points in the information codes of the data frames, no solution is attained for the outer codes of the product code as shown in FIG. 2. Thus, in a data frame which comprises only the check points of outer codes and the inner codes, the suppression effect for the low frequency band component of the code sequence is materially lowered.

In the method of switching the rows of the data matrix to which the outer codes of the product code are to be added, the above problem may be solved but a method for generating the outer code must be changed from column to column, and it is also necessary to change a start point of coding of the outer code in addition to generate the outer code. Particularly when there are many check points of the generated outer codes, it is necessary to select a pattern which avoids the continuation of the check points of the outer codes along the row direction. As a result, a complex process is required.

SUMMARY OF THE INVENTION

It is an object of the present invention to solve the above problems.

It is another object of the present invention to provide a code transmitting method for transmitting an information code having an error detection or correction code of a product code added thereto, which method can effectively suppress a low frequency band component without a complex process.

In order to achieve the above object, in accordance with one aspect of the present invention, there is provided a code transmitting method comprising:

a first step of sampling an information code diagonally on a code matrix having the information code two-dimensionally arranged to form a first error detection or correction code and adding said first error detection or correction code along a row direction of the code matrix;

a second step of sampling along the row direction the code of the code matrix having the first error detection or correction code added thereto and adding said second error detection or correction code along the row direction of the code matrix, and a third step of sequentially transmitting, for each line, the code of the code matrix having the first and second error detection or correction codes added thereto.

In accordance with the above code transmitting method, the first error detection or correction code is generated by sampling the information code diagonally on the matrix having the information code two-dimensionally arrayed, and the second error detection or correction code is generated by sampling the codes of the respective rows of the matrix having the first error detection or correction code added thereto. Accordingly, both of the first error detection or correction code and the second error detection or correction code which form the product code can be added along the row direction of the matrix having the information code two-dimentionally arrayed, and no row comprises only the check points of the error detection or correction code. Thus, the low frequency band component can be suppressed by sequentially transmitting the codes of the respective rows of the matrix having the second error detection or correction code added thereto.

Further, in accordance with the above method, the first error detection or correction code and the second error correction or detection code can be readily distributedly arranged in the information codes of the respective rows of the matrix having the second error detection or correction code added thereto. Therefore, a transmission code having a higher suppression effect for the low frequency band component can be generated in a simple process.

It is a further object of the present invention to provide an error detection or correction coding apparatus which can add an error detection or correction code which forms a product code, with a simple configuration, to generate a code sequence having a small low frequency band component.

In order to achieve the above object, in accordance with another aspect of the present invention, there is provided an error check code encoding apparatus comprising:

a memory for storing a code matrix having an information code two-dimensionally arranged;

outer code generating means for accessing said memory to sample the information code diagonally on the code matrix to form a first error detection or correction code and adding the first error detection or correction code along the row direction of the code matrix; and inner code generating means for sampling, for each row, the information code of the code matrix sequentially read from said memory row by row to form a second error detection or correction code and adding the second error detection or correction code along the row direction of the code matrix.

Other objects and features of the present invention will be apparent from the following detailed description of the preferred embodiment when taken in conjunction with the accompanying drawings.

BRIEF DESCRIPTION OF THE DRAWINGS

FIG. 1 shows a format of a conventional data frame,

FIG. 2 shows a conventional data matrix having an error detection or correction code of a product code added thereto FIGS. 5 to 10 illustrate coding processes in one embodiment of the code transmitting method of the present invention, FIG. 5 illustrates the code sampling when an outer code (first error detection or correction code on a matrix having the information code two-dimensionally arrayed is generated, FIG. 6 shows a data matrix having an outer code added thereto by a conventional generation matrix, FIG. 7 shows a code word of a code array having the outer code added thereto in accordance with the embodiment, FIG. 8 shows a data matrix having the outer code added thereto in accordance with the embodiment, FIG. 9 shows a code word of a code array having an inner code (first error detection or correction code) added thereto in accordance with the embodiment, FIG. 10 shows a data matrix having the inner code added thereto in accordance with the present invention, and FIG. 11 hows a block diagram of a code transmitting apparatus in accordance with an embodiment of the present invention.

DETAILED DESCRIPTION OF THE PREFERRED EMBODIMENTS

One embodiment of the present invention is now explained.

Figure 11:
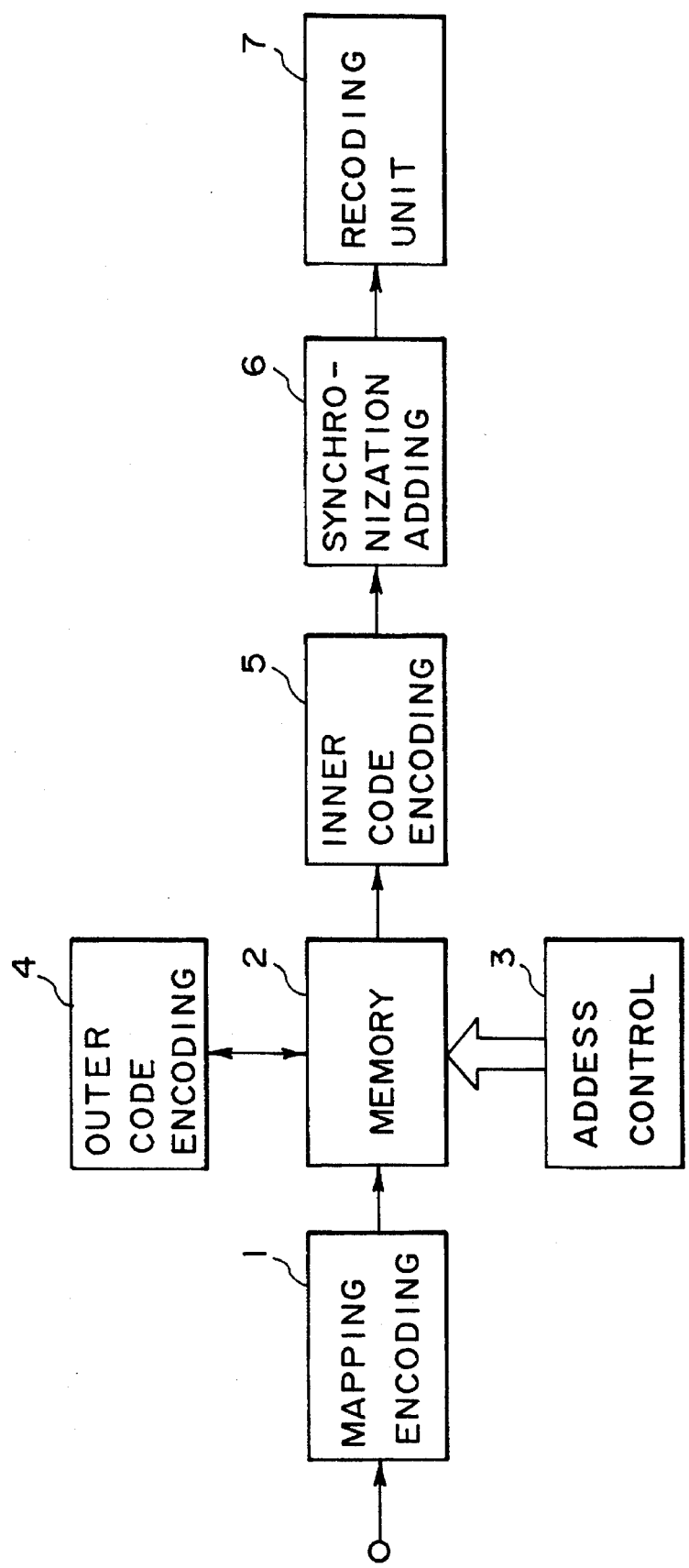

FIG. 11 shows a block diagram of a digital recording apparatus which is a code transmitting apparatus, in accordance with one embodiment of the present invention. Numeral 1 denotes a mapping encoding circuit, which is a modulation circuit for suppressing a low frequency band component by making use of correlation of input digital information. Numeral 2 denotes a memory for developing an information code received from the mapping coding circuit into a two-dimensional array, and numeral 3 denotes an address control circuit for controlling an address of the memory 2.

FIG. 6 shows a data matrix having synchronous data added to the two-dimensionally arrayed information code. An arrow in FIG. 6 shows a sequence of code transmission. In the apparatus of the present embodiment, an error detection or correction code which detects or corrects an error generated on a transmission line comprises a chained code of an inner code and an outer code. Numeral 4 in FIG. 11 denotes an outer code encoding circuit, numeral 5 denotes an inner code encoding circuit, numeral 6 denotes a synchronous signal insertion circuit and numeral 7 denotes a recording unit.

Figure 3:
FIG. 3 illustrates a distributed arrangement of check points in information code.
Figure 4:
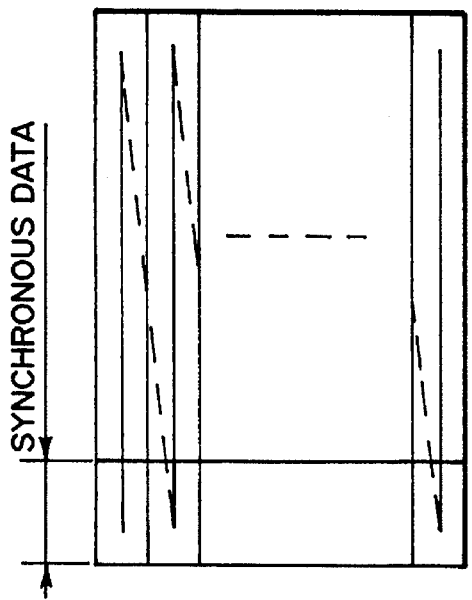
FIG. 4 shows a scan direction, in a transmission mode, of a matrix having the information code two-dimensionally arranged.

An operation of the outer code encoding circuit 4 is now explained. In the transmission apparatus of the present embodiment, the sampling direction of the information code (data) for generating the code is diagonal to the transmission direction or the direction of the data frame (row) of the data matrix of FIG. 4, and the information code is scanned and sampled as shown by an arrow in FIG. 5. Synchronous data shown in FIGS. 4 and 5 are added by the synchronous signal insertion circuit 6 but they are shown in order to clarify the transmission direction.

Where the outer code (first error detection or correction code) is generated by a conventional method based on the information code scanned and sampled in this manner, it is added to the end of each data frame (row) in the direction of data frame (row direction) as shown in FIG. 6.

This is explained by using a (11, 7) reduced cyclic Hamming code while using a simple polynomial $(X^4+X+1)$ on a Galois body GF (2) as a generation polynomial. A vector of a root of $(X^{15}-1)$ is expressed by (0010). In this case, a check matrix $H_1$ for the error detection or correction of the code word is expressed by $$H_1 = |a^{10}\ a^9\ a^8\ a^7\ a^6\ a^5\ a^4\ a^3\ a^2\ a\ 1| \qquad (1)$$

$$= \begin{vmatrix} 0\ 1\ 0\ 1\ 1\ 0\ 0\ 1\ 0\ 0\ 0 \\ 1\ 0\ 1\ 0\ 1\ 1\ 0\ 0\ 1\ 0\ 0 \\ 1\ 1\ 0\ 1\ 0\ 1\ 1\ 0\ 0\ 1\ 0 \\ 1\ 0\ 1\ 1\ 0\ 0\ 1\ 0\ 0\ 0\ 1 \end{vmatrix}$$

It is divided into a (4×4) unit matrix $I_4$ and other portion, (4×7) matrix P so that it is expressed by $$H_1 = P_1 I_4 \qquad (2)$$

Since the generation matrix $G_1$ for the (11, 7) reduced cyclic Hamming code meets $$g_1 H_1^T = 0 \qquad (3)$$

where T at the right top of $H_1$ is a symbol representing a transposition of the matrix. Thus, $$G_1 = I_7 P_1^T \quad (4)$$

$$= \begin{vmatrix} 1 0 0 0 0 0 0 0 1 1 1 \\ 0 1 0 0 0 0 0 1 0 1 0 \\ 0 0 1 0 0 0 0 0 1 0 1 \\ 0 0 0 1 0 0 0 1 0 1 1 \\ 0 0 0 0 1 0 0 1 1 0 0 \\ 0 0 0 0 0 1 0 0 1 1 0 \\ 0 0 0 0 0 0 1 0 0 1 1 \end{vmatrix}$$

The error detection/correction code for the code word is added by the matrix $G_1$ so that the data frame shown in FIG. 6 is generated. The partial matrix $I_4$ of the matrix $H_1$ corresponds to the check point of the code word, and the partial matrix $I_7$ of the matrix $G_1$ corresponds to the information point of the code word.

By simply generating the outer code by the generation matrix $G_1$, it is possible to uniformly distribute the outer code check points to the respective data frames (rows) of the matrix without concentrating them in one data frame. In the present embodiment, the outer code check points are further distributedly arranged in each data frame.

In the present embodiment, the outer code check points are distributedly arranged in the information code sampled for the generation of the outer code. The information code is not sampled for each column (longitudinal) on the data matrix, as is done in the prior art, but sampled diagonally for generating the outer code of the product code. In this manner, a great effect to be described later is brought about. A specific method for distributedly arranging the outer code check points in the sampled information code is now explained.

In the check matrix $H_1$, the MSB position of the code word corresponds to the leftmost end of the matrix. Thus, in order to generate a code having the frame format shown in FIG. 5, a new matrix $H_1'$ having unit matrices distributedly arranged in the check matrix $H_1$ so that the respective columns corresponding to the check points of FIG. 5 function as parts of the unit matrix, is assumed. The matrix $H_1'$ is derived by applying a basic row operation of the matrix to the matrix $H_1$, and the resulting matrix $H_1'$ is on the same code system as that of $G^1$.

Figures 7, 8:
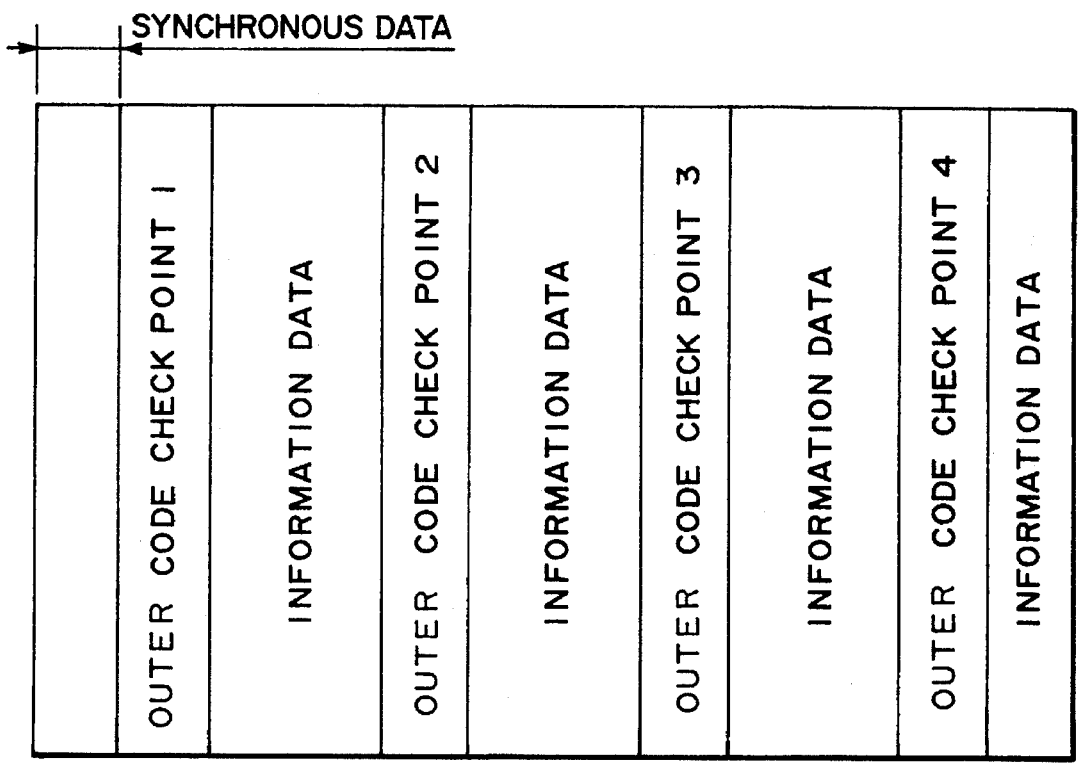

In the (11, 7) reduced cyclic Hamming code, it is assumed that the check points are to be distributedly arranged at the bit position 1, 4, 7 and 10 as counted from the left of the code word. FIG. 7 shows a format of the code word in the present example.

The basic row operation is applied to the matrix $H_1'$ until it takes a form of $$H_1' = \begin{vmatrix} 1..0..0..0. \\ 0..1..0..0. \\ 0..0..1..0. \\ 0..0..0..1. \end{vmatrix}$$

Thus, we get $$H_1' = \begin{vmatrix} 1 0 1 0 1 1 0 0 1 0 0 \\ 0 1 0 1 1 0 0 1 0 0 0 \\ 0 1 0 0 0 1 1 1 1 0 1 \\ 0 1 1 0 0 1 0 0 0 1 1 \end{vmatrix} \quad (5)$$

The columns 1, 4, 7 and 10 of the matrix $H_1'$ form the unit matrix $I_4$.

Then, a matrix $G_1'$ is generated from the matrix $H_1'$ in the same manner as that in which the matrix $G_1$ was generated from the matrix $H_1$. The unit matrix $I_4$ in the formula (2) represents the columns 1, 4, 7 and 10 of the matrix $H_1'$, and $P_1$ represents a (4×7) matrix comprising the columns 2, 3, 5, 6, 8 and 9.

The distributedly arranged unit matrix $I_4$ is converted to $I_7$ while it is kept distributedly arranged, and the divided matrix $p^1$ is also transpositioned as it is to generate $P_1^T$. They are combined to get $$G_1' = \begin{vmatrix} 0 1 0 1 0 0 1 0 0 1 0 \\ 1 0 1 0 0 0 0 0 0 1 0 \\ 1 0 0 1 1 0 0 0 0 0 0 \\ 1 0 0 0 0 1 1 0 0 1 0 \\ 0 0 0 1 0 0 1 1 0 0 0 \\ 1 0 0 0 0 0 1 0 1 0 0 \\ 0 0 0 0 0 0 1 0 0 1 1 \end{vmatrix} \quad (6)$$

where, like the matrix G, the divided partial matrix $I_7$ (columns 2, 3, 5, 6, 8, 9 and 11) in the matrix $G_1'$ corresponds to the information point of the code word.

The code word generated by the matrix $G_1'$ is shown in FIG. 7, in which the check points for the error detection/correction are distributedly arranged. The check matrix for the code word can detect or correct the error by using either the matrix $H_1'$ or the matrix $H_1$, and both the code word generated by the matrix $G_1$ and the code word generated by the matrix $G_1'$ are on the same code scheme.

The outer code check point thus generated are two-dimensionally arranged on the memory 2 as shown in FIG. 8. The outer codes are arranged diagonally. By laterally (for each row) scanning the data matrix having the outer code added thereto and sending it out to the succeeding storage, the outer code check points are distributed on the time axis.

The same operation is carried out for the inner code. A data sequence including the outer code generated by laterally scanning the data matrix shown in FIG. 8 is handled as input data. Following to the distributed arrangement of the check points of the outer code, the check points of the inner code are generated and distributedly arranged.

Since the code word of the outer code is used as the information code of the inner code, the inner code may be a (15, 11) cyclic Hamming code. Similarly, a conventional check matrix $H_2$ which uses $(X^4+X+1)$ as a generation polynomial is given by $$H_2 = |a^{14}\, a^{13}\, a^{12}\, a^{11}\, a^{10}\, a^9\, a^8\, a^7\, a^6\, a^5\, a^4\, a^3\, a^2\, a\, 1| \quad (7)$$

$$= \begin{vmatrix} 1 1 1 1 0 1 0 1 1 0 0 1 0 0 0 \\ 0 1 1 1 1 0 1 0 1 1 0 0 1 0 0 \\ 0 0 1 1 1 1 0 1 0 1 1 0 0 1 0 \\ 1 1 1 0 1 0 1 1 0 0 1 0 0 0 1 \end{vmatrix}$$

Like the outer code, the generation matrix $G_2$ for the matrix Ha is given by $$G_2 = \begin{vmatrix} 1 0 0 0 0 0 0 0 0 0 1 0 0 1 \\ 0 1 0 0 0 0 0 0 0 0 1 1 0 1 \\ 0 0 1 0 0 0 0 0 0 0 1 1 1 1 \\ 0 0 0 1 0 0 0 0 0 0 1 1 1 0 \\ 0 0 0 0 1 0 0 0 0 0 0 1 1 1 \\ 0 0 0 0 0 1 0 0 0 0 1 0 1 0 \\ 0 0 0 0 0 0 1 0 0 0 0 1 0 1 \\ 0 0 0 0 0 0 0 1 0 0 1 0 1 1 \\ 0 0 0 0 0 0 0 0 1 0 0 1 1 0 0 \\ 0 0 0 0 0 0 0 0 0 1 0 0 1 1 0 \\ 0 0 0 0 0 0 0 0 0 0 1 0 0 1 1 \end{vmatrix} \quad (8)$$

Figure 9:
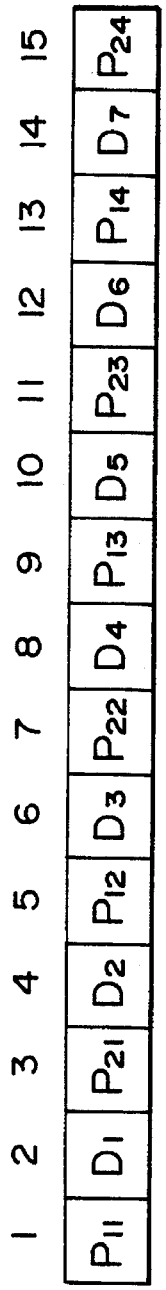

However, when the matrix $G_2$ is used, the inner code check points are concentrated in the latter half of the code word. In order to solve the above problem and suppress the generation of the low frequency band component due to the check points, the inner code check points are distributedly arranged in the respective rows of the matrix of FIG. 8 without keeping continuation with the previously generated outer code check points, in the present embodiment. The code word is configured as shown in FIG. 9 so that the inner code check point is arranged at a mid-point of two adjacent outer code check points previously added. In FIG. 9, $P_{11}$–$P_{14}$ denote the previously added outer code check points, and $P_{21}$–$P_{24}$ denote the inner code check point to be added this time. $D_1$–$D_7$ denote information codes.

As shown in FIG. 9, the check matrix $H_2'$ corresponding to the code having the check points distributedly arranged is subject to the basic row operation based on the matrix $H_2$ (formula (7)) until it takes a form of $$H_2' = \begin{vmatrix} ..1...0...0...0 \\ ..0...1...0...0 \\ ..0...0...1...0 \\ ..0...0...0...1 \end{vmatrix}$$

Thus, it is expressed by $$H_2' = \begin{vmatrix} 1 1 1 1 0 1 0 1 1 0 0 1 0 0 0 \\ 1 0 0 0 1 1 1 1 0 1 0 1 1 0 0 \\ 1 1 0 0 1 0 0 0 1 1 1 1 0 1 0 \\ 0 1 0 1 1 0 0 1 0 0 0 1 1 1 1 \end{vmatrix} \quad (9)$$

where the columns 3, 7, 11 and 15 represent the unit matrix $I_4$. Like the outer code case, the matrix $G_2'$ is derived from the matrix $H_2'$.

$$G_2' = \begin{vmatrix} 1 0 1 0 0 0 1 0 0 0 1 0 0 0 0 \\ 0 1 1 0 0 0 0 0 0 0 1 0 0 0 1 \\ 0 0 1 1 0 0 0 0 0 0 0 0 0 0 1 \\ 0 0 0 0 1 0 1 0 0 0 0 1 0 0 0 1 \\ 0 0 1 0 0 1 1 0 0 0 0 0 0 0 0 \\ 0 0 1 0 0 0 1 1 0 0 0 0 0 0 1 \\ 0 0 1 0 0 0 0 0 1 0 1 0 0 0 0 \\ 0 0 0 0 0 0 1 0 0 1 1 0 0 0 0 \\ 0 0 1 0 0 0 1 0 0 0 1 1 0 0 1 \\ 0 0 0 0 0 0 0 0 0 0 1 0 0 1 1 \end{vmatrix} \quad (10)$$

Figure 10:
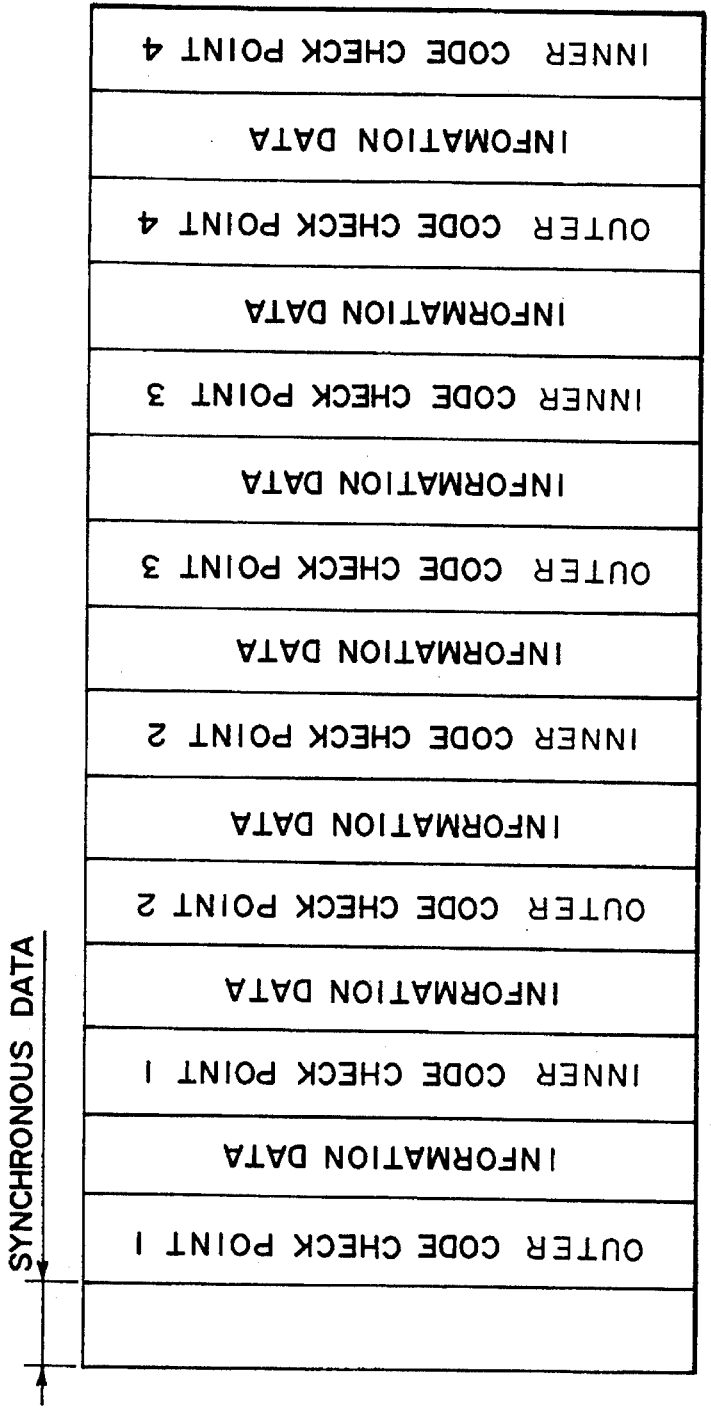

Where, like the matrix $G_1'$, the divided partial matrix $I_{11}$ (colons, 2, 4, 6, 8, 10, 12 and 14) in the column $G_2'$ corresponds to the information point of the code word. Further, the columns 1, 5, 9 and 13 correspond to the outer code check points. FIG. 10 shows a two-dimensional arrangement of the code word generated by using the matrix $G_2'$. By laterally (row direction) scanning and sending the information to the transmission line, both the outer code check points and the inner code check points are distributed on the time axis.

The code sequence having the outer code check points and the inner code check points distributed on the time axis is sent to the recording unit 7 where it is recorded on a recording medium. Thus, when it is reproduced in a playback mode, a code error is hardly at all produced.

In the code transmitting apparatus of the present embodiment, the low frequency band component of the code sequence to be transmitted (recorded) is very low and the probability of error in the transmitted code sequence is very small. From the standpoint of processing, the process to generate the error detection or correction code is similar to the prior art process and no additional process is required.

In the present embodiment, the (11, 7) reduced cyclic Hamming code and (15, 11) cyclic Hamming code were used to simplify the explantation. As a result, in the final code sequence, the 1-bit check points and the 1-bit information codes are alternately transmitted. Alternatively, the check points may be distributedly arranged by the same manner in case that a multi-dimension code which handles the information code by a word unit, that is, a plurality of bits is used.

The code length may be longer and the check points may be distributedly arranged with one word for a plurality of words. In this case, the error detection or correction code may be added without substantially losing the effect of the low frequency suppression modulation system applied to the information code.

In accordance with the present invention, where the information code is transmitted with the addition of the error detection or correction code which forms the product code, the low frequency band component is effectively suppressed without a complex process.

What is claimed is:

1. A code transmitting method comprising:

(a) a first step of sampling information codes on a code matrix having the information codes two-dimensionally arranged, horizontally and vertically, to form a first error detection or correction check codes and adding the first error detection or correction check codes along the horizontal direction of the code matrix so that the plurality of first error detection or correction check codes are dispersed therein without being adjacent to each other in the horizontal direction of the code matrix;

(b) a second step of sampling the information codes of the code matrix provided by said first step to form second error detection or correction check codes, and adding the second error detection or correction check codes to the code matrix provided by said first step so that the first and second error detection or correction check codes are dispersed therein, so that the plurality of second error detection or correction check codes are dispersed therein without being adjacent to each other in the horizontal direction of the code matrix, said information codes being double error detection or correction encoded by the first and second error detection or correction check codes; and (c) a third step of sequentially transmitting, for each horizontal line, the codes of the code matrix provided by said second step.

2. A code transmitting method according to claim 1 wherein, in said first step, a unit matrix is distributedly arranged in a check matrix together with the code matrix used for generating the first error detection or correction check codes, along the horizontal direction of the check matrix.

3. A code transmitting method according to claim 1 wherein, in the second step, said second error detection or correction check codes are added such that the first and second detection or correction check codes are distributedly arranged along the horizontal direction of the code matrix.

4. A code transmitting method according to claim 1 wherein, in said second step, a unit matrix is distributedly arranged in a check matrix together with the code matrix used for generating the second error detection or correction check codes, along the horizontal direction of the check matrix.

5. A code transmitting method according to claim 1 wherein, said third step includes a step of outputting, for each said horizontal line, codes of the code matrix having the first and second error detection or correction check codes added thereto and adding a synchronous code to each said horizontal line.

6. A code transmitting method comprising:

(a) a first step of sampling information codes from a code matrix having the information codes two-dimensionally arranged, for a plurality of horizontal lines, at least one for each vertical line, to form a plurality of first error detection or correction check codes and adding said first error detection or correction check codes along the horizontal direction of the code matrix so that the plurality of first error detection or correction check codes are dispersed therein without being adjacent to each other in the horizontal direction of the code matrix;

(b) a second step of sampling, along the horizontal direction, the codes of the code matrix provided by said first step to form a plurality of second error detection or correction check codes, and adding said second error detection or correction check codes along the horizontal direction of the code matrix so that each horizontal line has the information codes arranged along the horizontal direction of the code matrix and said first and second error detection or correction check codes added thereto with the plurality of second error detection or correction check codes being dispersed therein without being adjacent to each other in the horizontal direction of the code matrix; and (c) a third step of sequentially transmitting, for each horizontal line, the codes of the code matrix provided by said second step.

7. A code transmitting method according to claim 6 wherein, in said second step, the second error detection or correction check codes are added such that the second error detection or correction check codes are distributedly arranged along the horizontal direction of the code matrix.

8. A code transmitting method comprising:

(a) a first step of sampling information codes diagonally on a code matrix having the information codes two-dimensionally arranged, horizontally and vertically, on a memory to form a first error detection or correction check codes and adding the first error detection or correction check codes along the horizontal direction of the code matrix so that the plurality of first error detection or correction check codes are dispersed therein without being adjacent to each other in the horizontal direction of the code matrix, (b) a second step of reading from the memory, for each of a plurality of horizontal lines, the codes of the code matrix obtained by said first step;

(c) a third step of sampling, for each said horizontal line, the information codes and the first error detection or correction check codes of the code matrix obtained by said second to form second error detection or correction check codes and adding the second error detection or correction check codes along the horizontal direction of the code matrix so that each horizontal line has the information codes arranged along the horizontal direction of the code matrix and so that the plurality of second error detection or correction check codes are dispersed therein without being adjacent to each other in the horizontal direction of the code matrix; and (d) a fourth step of sequentially transmitting, for each horizontal line, the codes of the code matrix obtained by said third step.

9. A code transmitting method according to claim 8 wherein, in said third step, the second error detection or correction check codes are added such that the first error detection or correction check codes are distributedly arranged along the horizontal direction of the code matrix.

10. An error check code encoding apparatus comprising:

(a) a memory for storing a code matrix having information codes two-dimensionally arranged, horizontally and vertically;

(b) outer code forming means for accessing said memory to sample the information codes diagonally on the code matrix to form a plurality of first error detection or correction check codes along the horizontal direction of the code matrix so that the plurality of first error detection or correction check codes are dispersed therein without being adjacent to each other in the horizontal direction of the code matrix;

(c) inner code forming means for sampling, for each of a plurality of horizontal lines, the information codes of the code matrix sequentially read from said memory to form a plurality of second error detection or correction check codes and adding the second error detection or correction check codes along the horizontal direction of the code matrix so that each horizontal line has the information codes arranged along the horizontal direction of the code matrix and said first and second error detection or correction check codes added thereto with the plurality of second error detection or correction check codes being dispersed therein without being adjacent to each other in the horizontal direction of the code matrix; and (d) transmitting means for transmitting, for each said horizontal line, the codes of the code matrix having the first and second error detection or correction check codes added thereto.

11. An error check code encoding apparatus according to claim 10, further comprising synchronous signal insertion means for inserting a synchronous signal for each horizontal line of the code matrix, for the code sequence having the first and second error detection or correction check codes added thereto.

12. An error check code encoding apparatus according to claim 10, wherein, said outer code forming means adds the first error detection or correction check codes such that the first error detection or correction check codes are distributedly arranged along the horizontal direction of the code matrix.

13. An error check code encoding apparatus comprising:

(a) a memory for storing a code matrix having information codes two-dimensionally arranged, horizontally and vertically;

(b) first error detection or correction coding means for accessing said memory to sample the information codes of the code matrix to form first error detection or correction check codes and adding the first error detection or correction check codes along the horizontal direction of the code matrix so that the plurality of first error detection or correction check codes are dispersed therein without being adjacent to each other in the horizontal direction of the code matrix;

(c) second error detection or correction coding means for sampling the information codes of the code matrix sequentially read from said memory to form second error detection or correction check codes and adding the second error detection or correction check codes along the horizontal direction of the code matrix so that the plurality of second error detection or correction check codes are dispersed therein without being adjacent to each other in the horizontal direction of the code matrix, said information codes being double error detection or correction check encoded by the first and second error detection or correction check codes; and (d) transmitting means for transmitting, for each said horizontal line, the codes of the code matrix having the first and second error detection or correction check codes added thereto.

* * * * *

UNITED STATES PATENT AND TRADEMARK OFFICE
CERTIFICATE OF CORRECTION

Page 1 of 3

PATENT NO. : 5,502,734

DATED : March 26, 1996

INVENTOR(S): Motokazu Kashida

It is certified that error appears in the above-identified patent and that said Letters Patent is hereby corrected as shown below:

ABSTRACT

Line 4, "two" should read -- two- --.

COLUMN 1

Line 44, "is" should read --in--.

COLUMN 2

Line 52, "matrix," should read --matrix;--
    Line 67, "two-dimentionally" should read
--two-dimensionally--.

COLUMN 3

Line 43, "thereto" should read --thereto,--.
    Line 45, "information" should read --an information--.
    Line 54, "arrayed" should read --arrayed)--.

UNITED STATES PATENT AND TRADEMARK OFFICE
CERTIFICATE OF CORRECTION

PATENT NO. : 5,502,734

DATED : March 26, 1996

INVENTOR(S) : Motokazu Kashida

It is certified that error appears in the above-identified patent and that said Letters Patent is hereby corrected as shown below:

COLUMN 4

Line 1, "hows" should read --shows--.
    Line 17, "coding" should read --encoding--.
    Line 67, "$g_1H_1^T=0$" should read --$G_1H_1^T=0$--.

COLUMN 6

Line 5, "matrix $p^1$" should read --matrix $P^1$--.
    Line 25, "point" should read --points--.
    Line 33, "to" should be deleted.
    Line 49, "matrix Ha" should read --matrix $H_2$--.

COLUMN 7

Line 8, "point" should read --points--.
    Line 10, "FIG. 9," should read --FIG. 9,
    the check points are distributedly arranged, and--.
    Line 65, "explantation." should read --explanation.--.

COLUMN 8

Line 49, "the" should read --said-- and "said" should
    read --the--.

UNITED STATES PATENT AND TRADEMARK OFFICE
CERTIFICATE OF CORRECTION

PATENT NO. : 5,502,734

DATED : March 26, 1996

INVENTOR(S) : Motokazu Kashida

It is certified that error appears in the above-identified patent and that said Letters Patent is hereby corrected as shown below:

<u>COLUMN 9</u>

Line 40, "matrix," should read --matrix;--.
    Line 47, "second" should read --second step--.

Signed and Sealed this

Third Day of September, 1996

Attest:

BRUCE LEHMAN

Attesting Officer    *Commissioner of Patents and Trademarks*